(12) United States Patent
Singh et al.

(10) Patent No.: US 7,023,372 B1
(45) Date of Patent: Apr. 4, 2006

(54) METHOD AND APPARATUS FOR SEGMENTED, SWITCHED ANALOG/DIGITAL CONVERTER

(75) Inventors: Ramesh Singh, Bangalore (IN); Eamonn Byrne, Limerick (IE); Asif Ahmad, Bangalore (IN); Srikanth Nittala, Bangalore (IN); Shubha Govindachar, Bangalore (IN)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/054,064

(22) Filed: Feb. 9, 2005

(51) Int. Cl.
*H03M 1/12* (2006.01)
(52) U.S. Cl. ........................ 341/155; 341/172
(58) Field of Classification Search ............... 341/172, 341/155, 144
See application file for complete search history.

(56) References Cited

U.S. PATENT DOCUMENTS

| | | | | |
|---|---|---|---|---|
| 5,525,920 | A  * | 6/1996 | Rakers et al. ................. | 327/65 |
| 5,684,487 | A  * | 11/1997 | Timko ......................... | 341/172 |
| 5,949,156 | A  * | 9/1999 | Groover ....................... | 307/109 |
| 6,362,770 | B1 * | 3/2002 | Miller et al. ................ | 341/172 |
| 6,433,724 | B1 * | 8/2002 | Confalonieri et al. ........ | 341/155 |
| 6,433,727 | B1 * | 8/2002 | Yoshinaga .................... | 341/172 |
| 6,617,992 | B1 * | 9/2003 | Sakurai ....................... | 341/161 |
| 6,686,865 | B1 * | 2/2004 | Confalonieri et al. ........ | 341/172 |
| 6,747,522 | B1 * | 6/2004 | Pietruszynski et al. . | 331/177 R |
| 6,897,801 | B1 * | 5/2005 | Confalonieri et al. ........ | 341/172 |
| 2004/0075601 | A1 * | 4/2004 | Carreau et al. .............. | 341/172 |

* cited by examiner

*Primary Examiner*—Peguy JeanPierre
(74) *Attorney, Agent, or Firm*—Global IP Services, PLLC; Prakash Nama

(57) ABSTRACT

A switched-capacitor circuit for use in analog-to-digital conversion samples an input signal with respect to a reference voltage such that it significantly reduces a DAC settling time interval during each bit trial. In one exemplary embodiment, the switched-capacitor circuit having first and second groups of capacitor banks is coupled to a first input of a comparator and to a control circuit which provides control signals such that during a switching sequence, an equal value of capacitance is selected from each of the first and second groups of capacitor banks to reduce the DAC settling time interval, thereby improving the conversion rate.

21 Claims, 3 Drawing Sheets

METHOD AND APPARATUS FOR SEGMENTED, SWITCHED ANALOG/DIGITAL CONVERTER

FIELD OF THE INVENTION

This invention relates to the field of switched-capacitor techniques, and more specifically to method and apparatus for sampling and/or processing signals using switched-capacitors.

BACKGROUND OF THE INVENTION

Many systems employ switched-capacitor circuits that make use of capacitors and switches for sampling and/or processing signals. For example, analog-to-digital converters (ADCs) often employ such circuits to sample an analog signal, e.g., a voltage, prior to analog-to-digital conversion.

Generally, timing signals are employed in the switched-capacitor circuits, and such timing signals may have a sampling interval, a conversion interval following the sampling interval, and an output interval. The timing signals during the sampling intervals are commanded to a state that connects one or more of the capacitors in the switched-capacitor circuits to sample an input voltage with respect to a reference voltage. The timing signals during the conversion interval command switches in the switched-capacitor circuits to various states in accordance with a conversion algorithm, and monitor the resulting output signals from a comparator. The timing signals during the output interval provide a multi-bit digital output signal based on the output signals received from the comparator during the conversion interval.

The timing signals during the conversion interval may further include a DAC settling time interval and a strobe latch time interval. The DAC settling time for conventional techniques can be as much as 10 nanoseconds or more. This is due to the use of additional switches to simplify the DAC circuit design, which in-turn can increase resistance in the DAC settling path that can sign significantly increase settling time in the switched capacitor DAC circuit.

SUMMARY OF THE INVENTION

According to a first aspect of the invention there is provided an analog-to-digital converter comprising: a comparator having a first comparator input, a second comparator input, and a comparator output; a switched-capacitor circuit arranged to be connected to the first comparator input; a control circuit coupled between the comparator output and the switched-capacitor circuit to control an analog-to-digital conversion and deliver a digital output, wherein the switched-capacitor circuit further comprises: first and second groups of capacitor banks each having a plurality of bottom plates and a first and a second top plate, wherein the first and the second top plate is arranged to be selectively connected to the first comparator input; a plurality of capacitor-switches arranged to connect the associated bottom plates of first and second groups of capacitor banks to an analog input signal during a sampling interval; a first and a second switch arranged to selectively connect the first top plate and the second top plate of each of the first and second groups of capacitor banks to the first comparator input; a third and a fourth switch arranged to selectively connect the first top plate and the second top plate of the first and second groups of capacitor banks and a first and a second reference voltages VSS and VDD during the sampling interval; a binary-to-thermometric decoder coupled between the control circuit and the switched-capacitor circuit that receives the digital output and delivers a thermometric output as a function of the digital output, wherein the third and the fourth switches are turned-off and the first and the second switches arranged to connect the first top plate and the second top plate of the first and the second groups of capacitor banks to the first comparator input, respectively, substantially before start of a conversion interval, wherein the conversion interval starts substantially after completion of the sampling interval and the conversion includes one or more DAC settling intervals, and wherein the plurality of bottom plates of the first and the groups of capacitors connect to one of at least two reference voltages via the plurality of capacitor-switches during each DAC interval as a function of the thermometric output so that each of the first and second groups of capacitor banks result in having a substantially same capacitance value.

According to a second aspect of the invention, there is provided an analog-to-digital converter comprising: a switched-capacitor circuit, wherein the switched-capacitor circuit comprises: an array of capacitors having a first and a second group of capacitors; a plurality of capacitor-switches coupled to the associated first and the second group of capacitors; third and fourth switches being operable during a sampling interval to selectively connect the first and second group of capacitors between a first input voltage and a second signal line having a second voltage and a third signal line having third voltage via the plurality of associated capacitor-switches such that the first input voltage is sampled with respect to the second voltage and the third voltage, respectively, and wherein the third and fourth switches are substantially concurrently being operable to disconnect from the second and third voltages upon completion of the sampling the first voltage by the first and second group of capacitors; and a first and a second switch being operable during a conversion interval to selectively connect a TOP PLATE 1 and a TOP PLATE 2 of the first and second group of capacitors, respectively, to a first comparator input, such that an amount of charge stored by each of said array of capacitors is equal to (Ctotal*((VDD+VSS)/2−IN)), wherein the plurality of capacitor-switches are operable during the conversion interval to select a substantially equal value of capacitance value from each of the first and the second group of capacitors to provide an output signal.

The invention in another aspect provides a method of sampling an analog input signal using a switched-capacitor circuit comprising: sampling the analog input signal onto a first group of capacitors in an array of capacitors with respect to a second voltage; sampling the analog input signal onto a second group of capacitors in the array of capacitors with respect to a third voltage; selectively disconnecting the second and third voltages from the first and second group of capacitors, respectively, so that the first and second group of capacitors each have a floating capacitor plate substantially before a start of a conversion interval; and selectively connecting a first top plate and a second top plate of the first and second groups of capacitors, respectively, to a first comparator input during each DAC setting interval as a function of the control signal such that a plurality of bottom plates associated with the first and second groups of capacitor banks are selectively connected to one of the at least two reference voltage so that each of the first and the second groups of capacitor banks result in having substantially a same capacitance value.

DESCRIPTION OF PREFERRED EMBODIMENTS

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. The same reference number or label may refer to signals and connections, and the actual meaning will be clear from its use in the context of the description.

Terminology

The term "switch" means any type of switch. A switch may comprise one or more elements that function as a switch. For example, a switch may include but is not limited to one or more active elements (for example, one or more transistors) and may but need not employ MOS technology.

The term "capacitor" means any type of capacitor. A capacitor may comprise one or more elements that provide capacitance. For example, a capacitor may include but is not limited to metal, polysilicon and double polysilicon, metal metal, metal poly, poly diffusion, semiconductors, junction capacitors, parallel plate technology, adjacent conductors, fringing capacitors, and/or any combination thereof.

The term Analog/Digital converter (ADC) is to be understood to also include Digital/Analog converter (DAC) in the context of this invention. Also, in a capacitor or a capacitor bank, top and bottom plates of are to be understood as synonymous with first and second plates respectively.

Figure 1:
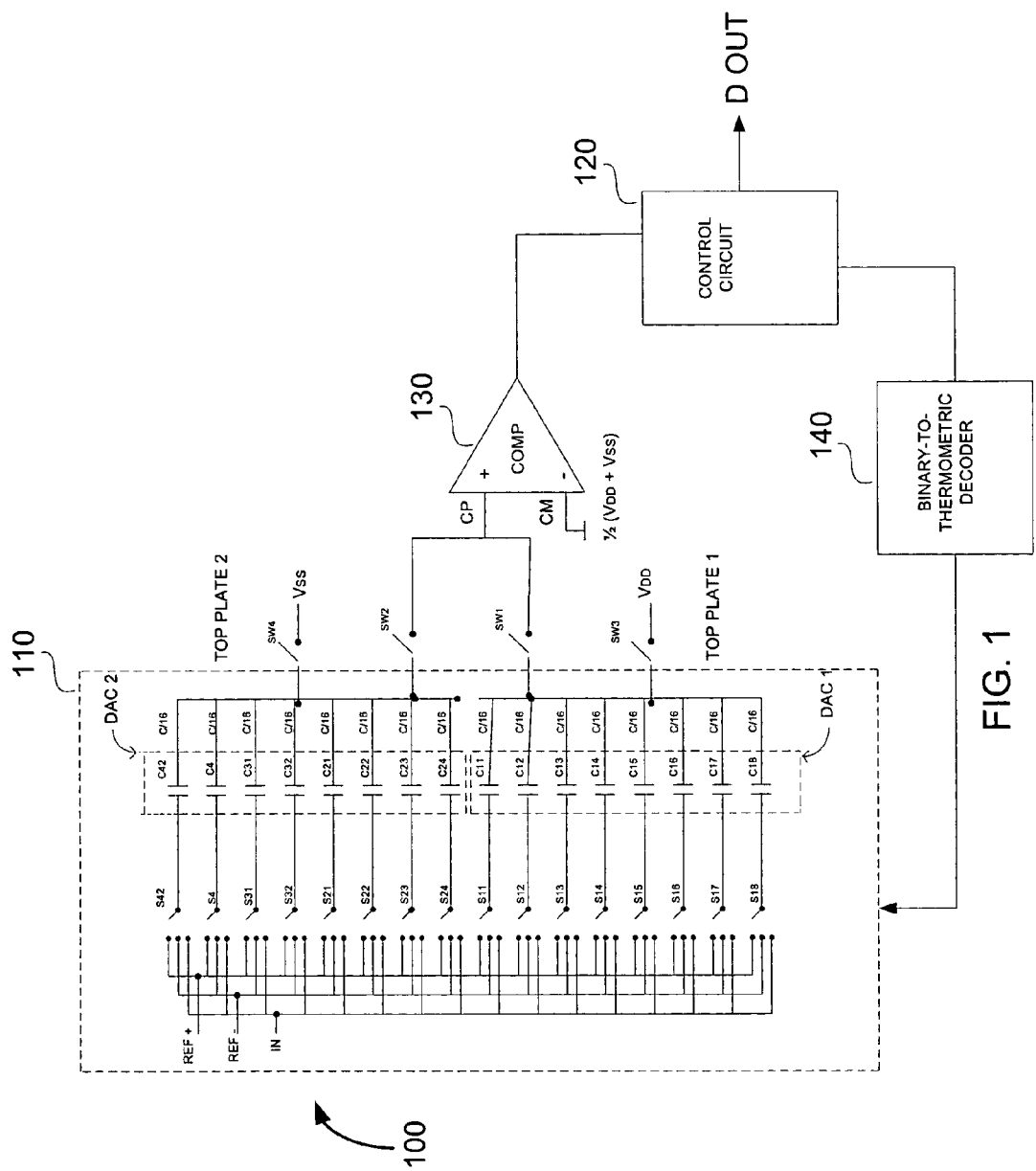
FIG. 1 is a schematic diagram of a switched-capacitor circuit according to one embodiment of the present invention.

FIG. 1 illustrates an example single ended architecture of an analog-to-digital converter 100. This embodiment of the analog-to-digital converter 100 includes a switched-capacitor circuit 110. The switched-capacitor circuit 110 includes first and second groups of capacitor banks DAC1 and DAC2, wherein DAC includes capacitors C21–C24, C31–C32, C4 and C4X, DAC2 includes capacitors C11–C18. Further, the switched-capacitor circuit 110 includes a plurality of capacitor-switches S21–S24, S31–S32, S4, S4X, and S11–S18. The present invention segments the first and second group of capacitor banks DAC 1 and DAC2 based on a thermometric selection scheme, which is based on $2^N-1$ digital inputs to represent $2^N$ different digital signals. This is different from a binary scheme of selection, which needs only N digital inputs to represent $2^N$ different digital values.

As shown in FIG. 1, the analog-to-digital converter 100 further includes a comparator 130, a control circuit 120, and a binary-to-thermometric decoder 140. Further as shown in FIG. 1, the comparator 130 is coupled between the switched-capacitor circuit 110 and the control circuit 120 and the binary-to-thermometric decoder 140 is coupled between the control circuit 120 and the switched-capacitor circuit.

The plurality of capacitor-switches S21–S24, S31–S32, S4, S4X, S11–S18 in the switched-capacitor circuit 110 are controlled by control signals supplied by the control circuit 120. The plurality of capacitor-switches S21–S24, S31–S32, S4, S4X, and S11–S18 may be identical to one another and have three operating states as shown. For example, capacitor-switch S11 selectively connects the associated capacitor C11 to an analog output signal and two reference voltages, IN, REF+, or REF–, respectively, switch S12 selectively connects the associated capacitor C12 to IN, REF+, REF–, and so on.

Figure 3:
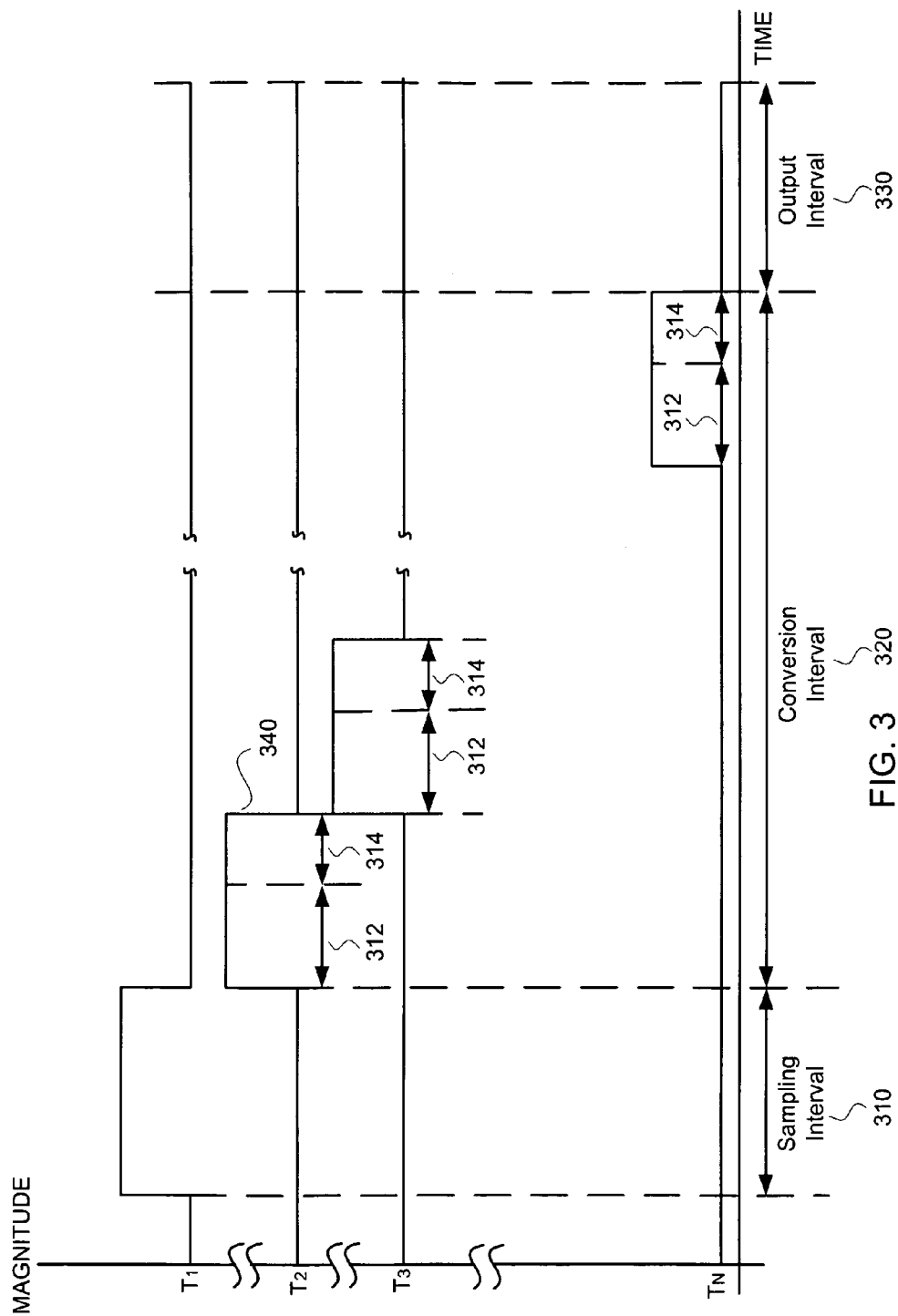
FIG. 3 illustrates timing signals used in one embodiment of the switched-capacitor circuit of FIGS. 1 and 2.

Referring now to FIG. 3, which shows timing signals T1, T2, T3 ... TN employed within the control circuit 120. Each of the timing signals T1, T2, T3 ... TN has two logic states represented by first and second voltage levels. These timing signals are merely representative of those actually used; in particular, two-state signals are used for convenience even when controlling a three-state switch and any ambiguity can be obviated from the context of the use. The timing signals T1, T2, T3 ... TN are shown on the same time axis. However this does not signify that one timing signal attains different voltage levels from the others.

In operation, with reference to FIG. 1, substantially before the completion of the sampling interval 310 (FIG. 3), the plurality of capacitor-switches S21–S24, S31–S32, S4, S4X, and S11–S18 are commanded to a state that connects each of the associated second group of capacitor banks C21–C24, C31–C32, C4 and C4X and the first group of capacitor banks C11–C18, respectively, to the analog input signal IN. First and second switches SW1 and SW2 are commanded to an open state and third and fourth switches SW3 and SW4 are commanded to a closed state, thereby connecting a first top plate TOP PLATE 1 of each of the first group of capacitors C11–C18 to the voltage signal VDD and connecting a second top plate TOP PLATE 2 of each of the second group of capacitor banks C21–C24, C31–C32, C4 and C4X to the voltage signal VSS. In this configuration, the analog input signal IN is sampled (with respect to voltage VSS) in each of the capacitors C21–C24, C31–C32, C4 and C4X, and further sampled (with respect to voltage VDD) in each of the capacitors C11–C18. In addition, the plurality of capacitor-switches S21–S24, S31–S32, S4, S4X, S11–S18 are commanded to a closed state that connects each of the capacitors C21–C24, C31–C32, C4 and C4X and C11–C18, respectively, to the analog input signal IN.

In some embodiments, first and second switches SW1 and SW2 are commanded to a close position to connect the TOP PLATE 1 and the TOP PLATE 2 of each the DAC 1 and DAC2 to a first comparator input CP during conversion interval 320 (FIG. 3). The third and fourth switches SW3 and SW4 are arranged to selectively connect the TOP PLATE 1 and the TOP PLATE 2 of the DAC 1 and DAC2 to VDD and VSS, respectively, during the sampling interval 310 (FIG. 3).

A conversion interval 320 that substantially follows the sampling interval 310 (FIG. 3). During the conversion interval 320 (FIG. 3), the control circuit 120 commands a plurality of capacitor-switches S21–S24, S31–S32, S4, S4X, and S11–S18 to various states in accordance with a conversion algorithm, and monitors the resulting output signals from the comparator 130. It is to be noted in the context of FIG. 3 that during the conversion interval 320, the control circuit 120 commands the conversion to take place on a bit-by-bit basis. For example, as shown in FIG. 3, the first bit conversion takes place during a first bit trial interval 340;

second bit conversion takes place during a second bit trial interval 350, and so on until the last bit conversion takes place during the last bit trial interval 360 as shown in the timing signals T2, T3 . . . TN.

Further, substantially at the end of completion of the sampling interval 310 and just before starting the first bit trial 340 (FIG. 3), SW1 and SW2 are commanded to a close state thereby connecting the TOP PLATE 2 of each of the second group of capacitor banks C21–C24, C31–C32, C4 and C4X to the first comparator input CP and the TOP PLATE 1 of each of the first group of capacitor banks C11–C18. Substantially simultaneously, the third and fourth switches SW3 and SW4 are commanded to an open state, thereby disconnecting the second plate of each of the second group of capacitor banks C21–C24, C31–C32, C4 and C4X and the first group of capacitor banks C11–C18, respectively, from the terminals supplying VSS and VDD. In this configuration, the second plate of each of these second group of capacitor banks C21–C24, C31–C32, C4 and C4X and the first group of capacitor banks C11–C18 is at a potential equal to ((VDD+VSS)/2) and the amount of charge stored by each of the first and the second group of capacitor banks C21–C24, C31–C32, C4 and C4X and C11–C18 is equal to that which would have been stored by the first and the second group of capacitor banks C21–C24, C31–C32, C4 and C4X and C11–C18 had the analog input signal IN been sampled with respect to ((VDD+VSS)/2). Thus, the above-described switching sequence results in generating ((VDD+VSS)/2) at terminal CP. The Ctotal refers to the total value of capacitance in the DAC1 and DAC2.

Also, as shown in FIG. 3, each first bit trial interval 340 includes a DAC settling interval 312 and a strobe latch interval 314. In each first bit trial interval, the control circuit 120 selects the plurality of capacitor-switches S21–S24, S31–S32, S4, S4X, and S11–S18 such that an equal value of capacitance value is selected from each of the first and second groups of capacitor banks DAC1 and DAC2. This type of capacitor selection during a bit trial is generally referred to as "thermometric" selection, which needs $2^N$-1 digital inputs to represent $2^N$ different digital values, whereas a binary selection requires only N digital inputs to represent $2^N$ different digital values. Such a thermometric selection scheme of connecting capacitors during a bit trial results in "segmentation" of the capacitors. The present invention uses the above-described scheme in a segmented DAC to select capacitors in the switched-capacitor circuit 110 to significantly lower the DAC settling time interval during conversion in each bit trial interval, thus improving the performance of the analog-to-digital converter 100. The thermometric scheme to select the capacitors is achieved using the binary-to-thermometric decoder, which outputs a thermometric signal as a function of a digital output received from the control circuit 120.

The above-described scheme does not introduce effect of switch resistance when connecting the two top plates TOP PLATE 1 and TOP PLATE 2 of the switched capacitor-circuit 110 to the first comparator input. Further, lowering the DAC settling time interval also improves the conversion of the analog-to-digital converter 100, which allows it to be used in both low and high speed applications. For example, during a first bit trial, if 8 capacitors C11–C18 in the switched- capacitor circuit 110 are connected to "REF+", the other 8 capacitors in the switched-capacitor circuit 110 are connected to "REF−" by the control circuit 120. Such a selection of substantially equal capacitance value in each of the first and second group of capacitor banks DAC 1 and DAC2 can be achieved by using a binary-to-thermometric decoder 140 shown in FIG. 1.

In some embodiments, the control circuit controls an analog-to-digital conversion and delivers a digital output. The binary-to-thermometric decoder receives the digital output and delivers a thermometric signal as a function of the digital output. The third and fourth switches SW3 and SW4 are turned-off and the first and second switches SW1 and SW2 are arranged to connect the TOP PLATE1 and the TOP PLATE2 of the DAC 1 and DAC2, respectively, to the first comparator input CP substantially before a start of a conversion interval. Further, the plurality of capacitor-switches S21–S24, S31–S32, S4, S4X, and S11–S18 selectively connect the plurality of bottom plates to REF+ and REF− during each DAC settling interval as a function of the thermometric signal so that an equal value of capacitance is selected from each DAC1 and DAC2.

In some embodiments an analog input signal is sampled onto a first group of capacitors DAC1 in an array of capacitors with respect to a second voltage REF+ during a sampling interval. Further, the analog input signal is sampled onto a second group of capacitors in the array of capacitors with respect to a third voltage REF− during the sampling interval. A control signal is then outputted as a function of the sampled analog input signal onto the first and the second group of capacitors DAC 1 and DAC2 and selectively disconnects the second and third voltages REF+ and REF− from the first and second group of capacitors DAC1 and DAC2, respectively, so that the first and second group of capacitors DAC1 and DAC2 each have a floating capacitor plate substantially before a start of a conversion interval. A first top plate and a second top plate TOP PLATE1 and the TOP PLATE2 of the first and second groups of capacitors DAC1 and DAC2, respectively, is selectively connected to the first comparator input CP substantially before start of the conversion interval 320. The plurality of bottom plates associated with the first and second groups of capacitor banks DAC 1 and DAC2 connect to one of at least two reference voltages REF+ and REF− so that substantially same value of capacitance is selected from each of the first and the second groups of capacitor banks DAC 1 and DAC2. In these embodiments, the sample of the analog input signal with respect to the second and third voltages is equal to ("REF+"+"REF−")/2.

In some embodiments, the control circuit 120 outputs at least one control signal in response to the analog-to-digital signal received from the switched-capacitor circuit 110. The binary-to-thermometric decoder 140 has an input line 142 and an output line 143. The at least one output control signal received from the control circuit 10 is coupled to the input line 142 of the binary-to-thermometric decoder 140. Further, the output line 144 of the binary-to-thermometric decoder 140 is coupled to the switched-capacitor circuit 110. The binary-to-thermometric decoder 140 supplies at least one control signal to the plurality of capacitor-switches C11–C18, C21–C24, C31, C32, C4, and C4X of the switched-capacitor circuit 110 such that the plurality of capacitor-switches are selected to provide an equal capacitance value in each of the first and the second group of capacitor banks DAC 1 and DAC2. In some embodiments the control circuit 120 includes one or more output lines to supply a multi-bit digital signal to the binary-to-thermometric decoder 140.

The following example further illustrates the above-described implementation scheme of selecting capacitors in the switched-capacitor circuit 110 to reduce the DAC settling time during a bit trial:

To implement the code 1111, the following sequence will be followed:

During a first bit trial, capacitors C11, C12, C13 and C14 from DAC1 and C21–C24 from DAC2 are selected to connect to REF+via the switches S11–S14 and S21–S24, respectively; C15–C18 from DAC1 and C31, C32, C4 and C4X are selected to connect to REF− via the switches S15–S18, S31, S32, S4, and S4X, respectively. During a second trial C15 and C16 from DAC1 and C31 and C32 from DAC 2 are commanded to disconnect from REF− and get reconnected to REF+ and so on.

Finally, during the output interval 330 (FIG. 3), the control circuit 120 provides a multi-bit digital output signal DOUT based on output signals from the comparator 130 during the conversion interval 320 (FIG. 3). The multi-bit digital output may be in the form of parallel data, e.g., provided by way of plurality of signal lines, or serial data, e.g., provided by way of a single signal line, or any combination thereof, e.g., some parallel data and some serial data.

Although the above embodiment shows a voltage that is, in effect, sampled with respect to ((VDD+VSS)/2), the present invention is not limited to such. For example, other embodiments may, in effect, sample a voltage with respect to any voltage or voltages.

Figure 2:
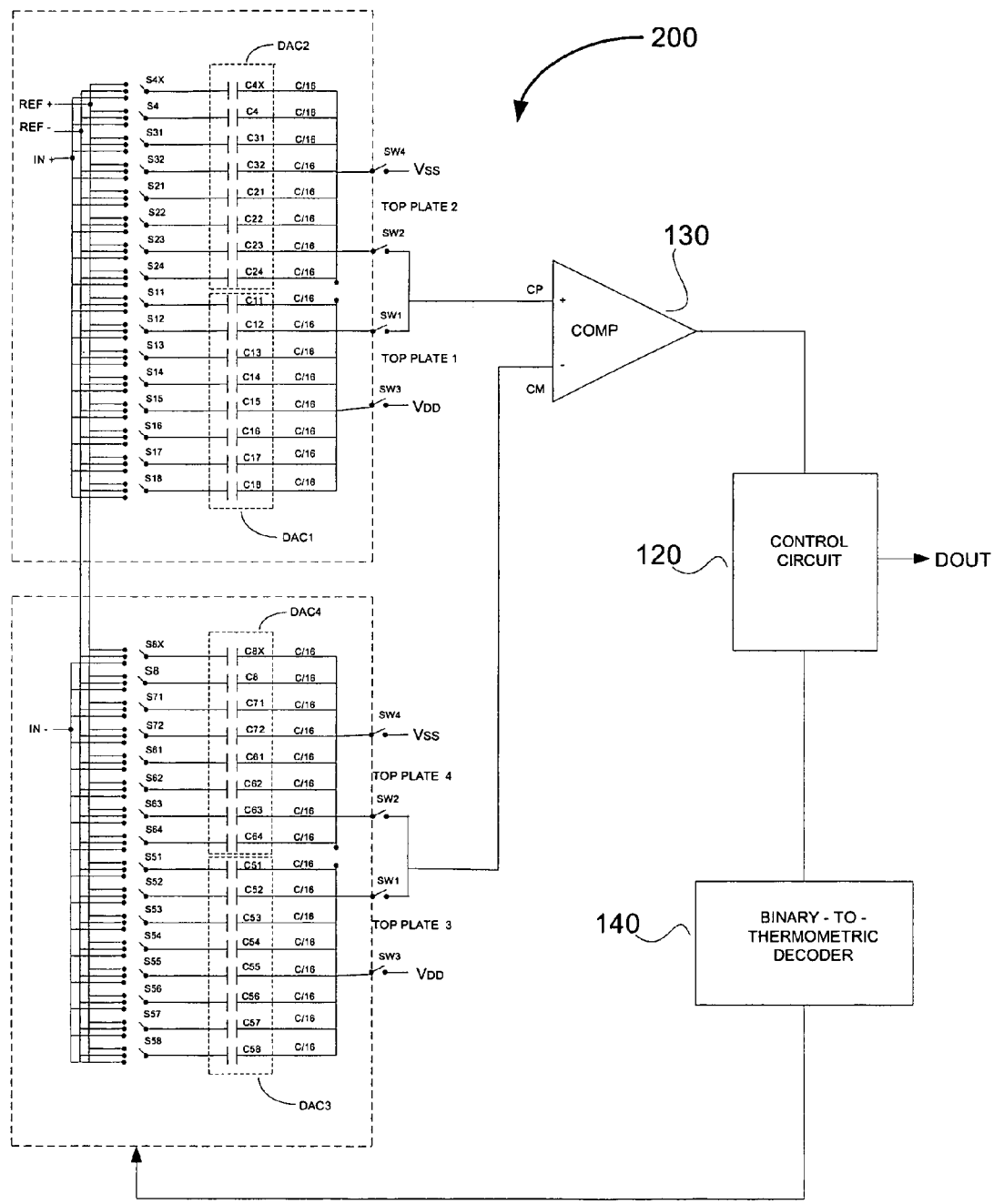
FIG. 2 is a schematic diagram of a switched-capacitor circuit of another embodiment of the present invention.

Although the embodiment of the switched-capacitor circuit 110 shown in FIG. 1 has a single-ended configuration, the present invention is not limited to such. Thus, some embodiments may employ a differential scheme as shown in FIG. 2. The embodiment of FIG. 2 identical to the embodiment shown in FIG. 1, except that the embodiment of FIG. 2 is a differential configuration, to receive a dual-ended input, IN+ and IN−.

It should be understood that although various embodiments above show a switched-capacitor circuit supplying one or more signals to a comparator (which may be a type of amplifier), the switched-capacitor circuits described herein are also useful in association with other types of circuits, e.g., non-comparator type amplifiers. For example, in some embodiments, a switched-capacitor circuit supplies one or more signal(s) to one or more non-comparator type of amplifier(s).

In addition, although the embodiments of the switched-capacitor circuits shown in FIGS. 1 and 2 are suitable for a 4-bit ADC, these embodiments are merely illustrative. The present invention is not limited to 4-bit ADCs. Indeed, as stated above, switched-capacitor techniques are used in many systems. Thus, the switched-capacitor circuits and techniques described above are not limited to successive approximation ADCs, or even ADCs in general, but rather may be used in any type of system.

Furthermore, although the DOUT signal described above indicates a ratio of the magnitude of the differential input signal, IN+, IN−, compared to the magnitude of the differential reference voltage, REF+, REF−, ADCs are not limited to such. For example, a DOUT signal may simply represent a value that is related to, e.g., proportional to, the magnitude of the input signal.

Although the DAC1 and DAC2 described above are fully segmented, this is not a requirement. The above-described technique can also combine a segmented DAC along with a binary-weighted DAC.

The above description is intended to be illustrative, and not restrictive. Many other embodiments will be apparent to those skilled in the art. The scope of the invention should therefore be determined by the appended claims, along with the full scope of equivalents to which such claims are entitled.

It is to be understood that the above-description is intended to be illustrative, and not restrictive. Many other embodiments will be apparent to those of skill in the art upon reviewing the above-description. The scope of the subject matter should, therefore, be determined with reference to the following claims, along with the full scope of equivalents to which such claims are entitled.

As shown herein, the present invention can be implemented in a number of different embodiments, including various methods, a circuit, an I/O device, a system, and an article comprising a machine-accessible medium having associated instructions.

Other embodiments will be readily apparent to those of ordinary skill in the art. The elements, algorithms, and sequence of operations can all be varied to suit particular requirements.

FIGS. 1 and 2 are merely representational and are not drawn to scale. Certain portions thereof may be exaggerated, while others may be minimized. FIGS. 1–2 illustrate various embodiments of the invention that can be understood and appropriately carried out by those of ordinary skill in the art.

It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus, the following claims are hereby incorporated into the detailed description of embodiments of the invention, with each claim standing on its own as a separate embodiment.

It is understood that the above description is intended to be illustrative, and not restrictive. It is intended to cover all alternatives, modifications and equivalents as may be included within the spirit and scope of the invention as defined in the appended claims. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein," respectively.

What is claimed is:

1. An analog-to-digital converter comprising:
 a switched-capacitor circuit having first and second groups of capacitor banks;
 a comparator having a first comparator input, a second comparator input, and a comparator output, wherein the switched-capacitor is coupled to the first comparator input; and
 a control circuit coupled to between the comparator output and the switched-capacitor circuit that provides control signals such that during a switching sequence, an equal value of capacitance is selected from each of the first and second groups of capacitor banks to reduce a DAC settling time interval.

2. The analog-to-digital converter of claim 1 wherein the control circuit that provides control signals comprises controlling an analog-to-digital conversion and delivering a digital output.

3. The analog-to-digital converter of claim 2, wherein each of the first and second groups of capacitor banks comprises a plurality of bottom plates and a first and a second top plate, wherein the first and the second top plate is arranged to be selectively connected to the first comparator input.

4. The analog-to-digital converter of claim 2, wherein the switched-capacitor circuit further comprises:
  a plurality of capacitor-switches arranged to connect the associated plurality of bottom plates of the first and the second groups of capacitor banks to an analog input signal during a sampling interval;
  a first and a second switch arranged to selectively connect the first top plate and the second top plate of each of the first and second groups of capacitor banks to the first comparator input; and
    a third and a fourth switch arranged to selectively connect the first top plate and the second top plate of the first and second groups of capacitor banks and a first and a second reference voltage, respectively, during the sampling interval.

5. The analog-to-digital converter of claim 4, further comprising:
  a binary-to-thermometric decoder coupled between the control circuit and the switched-capacitor circuit that receives the digital output and delivers a thermometric output as a function of the digital output, wherein the third and the fourth switches are turned-off and the first and the second switches are arranged to connect the first top plate and the second top plate of the first and the second groups of capacitor banks, respectively, to the first comparator input substantially before start of a conversion interval, wherein the conversion interval starts substantially after completion of the sampling interval and the conversion includes one or more DAC settling intervals, and wherein the plurality of bottom plates of the first and the second groups of capacitors connect to one of at least two reference voltages via the plurality of capacitor-switches during each DAC interval as a function of the thermometric output so that each of the first and second groups of capacitor banks result in having a substantially same capacitance value.

6. The analog-to-digital converter of claim 5, wherein the first and second reference voltages are VSS and VDD, respectively, including switching-means for sampling the analog input signal with respect to (VDD+VSS)/2.

7. An analog-to-digital converter comprising:
  a comparator having a first comparator input, a second comparator input and a comparator output;
  a switched-capacitor circuit having a first and a second capacitor means arranged to be connected to the first comparator input and the second comparator input, respectively;
  a control circuit coupled between the comparator output and the switched-capacitor circuit to control an analog-to-digital conversion and deliver a digital output, wherein each of the first capacitor means and the second capacitor means in the switched-capacitor circuit further comprises;
    first and second groups of capacitor banks each having a plurality of bottom plates and a first and a second top plate, wherein the first and the second top plate is arranged to be connected to the first comparator input;
    a plurality of capacitor-switches arranged to connect the associated bottom plates of first and second groups of capacitor banks to an analog input signal, REF+, and REF−;
    a first and a second switch arranged to selectively connect the first top plate and the second top plate of each of the first and second groups of capacitor banks to the first comparator input; and
    a third and a fourth switch arranged to selectively connect the first top plate and the second top plate of the first and second groups of capacitor banks, respectively, to one of at least two reference voltages which the analog input signal may be sampled with respect to, wherein the third and the fourth switches arranged to turned-off and the first and the second switches arranged to connect the first top plate and the second top plate of the first and the second groups of capacitor banks, respectively, to the first comparator input substantially before start of a conversion interval, wherein the conversion interval starts substantially after completion of the sampling interval and the conversion includes one or more DAC settling intervals, and wherein the plurality of bottom plates of the first and the groups of capacitors selectively connect to one of at least two reference voltages via the plurality of capacitor-switches during each DAC interval as a function of the digital output such that each of the first and second groups of capacitor banks result in having a substantially same capacitance value.

8. The analog-to-digital converter of claim 7, wherein each of the first and second groups of capacitor banks has substantially same capacitance and are arranged to be selectively connected through the first switch device to a first and a second reference voltage, respectively, of the at least two reference voltages.

9. The analog-to-digital converter of claim 8, wherein the first and second reference voltages are VSS and VDD, respectively, including switching means for sampling the analog input signal, with respect to (VDD+VSS)/2.

10. An analog-to-digital converter comprising:
  a switched-capacitor circuit, wherein the switched-capacitor circuit comprises:
    an array of capacitors having a first and a second group of capacitors;
    a plurality of capacitor-switches coupled to the associated first and the second group of capacitors;
    third and fourth switches being operable during a sampling interval to selectively connect the first and second group of capacitors between a first input voltage and a second signal line having a second voltage and a third signal line having third voltage via the plurality of associated capacitor-switches such that the first input voltage is sampled with respect to the second voltage and the third voltage, respectively, and wherein the third and fourth switches are substantially concurrently being operable to disconnect from the second and third voltages upon completion of the sampling the first voltage by the first and second group of capacitors; and
    first and second switches being operable during a conversion interval to selectively connect the first and second group of capacitors to connect to a first comparator input, such that an amount of charge stored by each of said array of capacitors is equal to (Ctotal*((VDD+VSS)/2−IN)), wherein the plurality of capacitor-switches are operable during the conversion interval to select a substantially equal value of capacitance from each of the first and the second group of capacitors to provide an output signal, and wherein the Ctotal being a total capacitance value of the first and second groups of capacitor banks.

11. The converter of claim 10, wherein the first and the second group of capacitors each have a TOP PLATE 1 and TOP PLATE 2, respectively, and wherein the third and fourth switches are selectively operable during the sampling interval to connect the TOP PLATE 1 and the TOP PLATE 2 between said first input voltage, said second voltage and said third voltage, respectively.

12. The converter of claim 11, wherein the third and fourth switches are substantially concurrently operable to disconnect the TOP PLAE 1 and the TOP PLATE 2 upon completion of the sampling the first voltage by the first and second group of capacitors.

13. The converter of claim 11, wherein the first and second switches are operable during the conversion interval to connect the TOP PLATE 1 and the TOP PLATE 2 of the first and second group of capacitors, respectively, to the first comparator input.

14. The converter of claim 10, further comprising:
a comparator having an input line, wherein the switched-capacitor circuit has an output line to supply an output signal, and wherein the input line of the comparator is connected to the output line of the switched-capacitor circuit.

15. The converter of claim 14, further comprising:
a control circuit having an input line coupled to the output line of the comparator and further having at least one output control signal; and
a binary-to-thermometric decoder having an input line and an output line, wherein the at least one output control signal of the control circuit is coupled to the input line of the binary-to-thermometric decoder, wherein the output line of the binary-to-thermometric decoder is coupled to the switched-capacitor circuit to supply at least one control signal to the plurality of capacitor-switches of the switched-capacitor circuit such that the plurality of capacitor-switches are selected to provide an equal capacitance value in each of the first and the second group of capacitor banks, and wherein the control circuit includes one or more output lines to supply a multi-bit digital signal.

16. The converter of claim 15, wherein the first and the second groups of capacitors are both connected to an output line of the switched-capacitor circuit.

17. The converter of claim 15, wherein the multi-bit digital signal supplied by the control circuit comprises a multi-bit digital signal generated in response to the output signal of the comparator during said conversion interval.

18. The converter of claim 15, wherein the at least one control signal supplied by the control circuit comprises at least one control signal generated in response to the output signal received from the comparator during a conversion interval.

19. A method of sampling an analog input signal using a switched-capacitor circuit comprising:
sampling the analog input signal onto a first group of capacitors in an array of capacitors with respect to a second voltage during a sampling interval;
sampling the analog input signal onto a second group of capacitors in the array of capacitors with respect to a third voltage during the sampling interval;
outputting a control signal as a function of the sampled analog input signal onto the first and the second group of capacitors;
selectively disconnecting the second and third voltages from the first and second group of capacitors, respectively, so that the first and second group of capacitors each have a floating capacitor plate substantially before a start of a conversion interval, wherein the conversion interval starts substantially after completion of the sampling interval and includes one or more DAC settling intervals; and
selectively connecting a first top plate and a second top plate of the first and second groups of capacitors, respectively, to a first comparator input during each DAC settling interval as a function of the control signal such that a plurality of bottom plates associated with the first and second groups of capacitor banks are selectively connected to one of at least two reference voltages so that each of the first and the second groups of capacitor banks result in having a substantially equal value of capacitance.

20. The method of claim 19, wherein the first and second group of capacitors have equal value of capacitances and wherein the second and third voltages are external reference voltages, REF+ and REF−, respectively, and the sample of the analog input signal with respect to the second and third voltages is equivalent to (("REF+"+"REF−")/2).

21. The method of claim 19, wherein the first and second group of capacitors have equal value of capacitances and the second and third voltages are external supply voltages, VDD and VSS, respectively, and the sample of the analog input signal with respect to the first voltage is equivalent to ((VDD+VSS)/2).

* * * * *